United States Patent
Tomioka et al.

(12) 
(10) Patent No.: US 6,602,362 B2
(45) Date of Patent: Aug. 5, 2003

(54) COPPER-ALLOY FOIL TO BE USED FOR SUSPENSION MEMBER OF HARD-DISC DRIVE

(75) Inventors: Yasuo Tomioka, Ibaraki-ken (JP); Tetsuo Maki, Ibaraki-ken (JP); Naohiko Era, Ibaraki-ken (JP)

(73) Assignee: Nippon Mining and Metals Co., Ltd., Tokyo (JP)

( * ) Notice: Subject to any disclaimer, the term of this patent is extended or adjusted under 35 U.S.C. 154(b) by 85 days.

(21) Appl. No.: 09/805,160

(22) Filed: Mar. 14, 2001

(65) Prior Publication Data

US 2002/0179198 A1 Dec. 5, 2002

(30) Foreign Application Priority Data

Mar. 14, 2000 (JP) ......................... 2000-070152
Feb. 15, 2001 (JP) ......................... 2001-038465

(51) Int. Cl.$^7$ ............................................... C22C 9/06
(52) U.S. Cl. ...................................................... 148/435
(58) Field of Search ......................................... 148/435

(56) References Cited

U.S. PATENT DOCUMENTS 4,749,548 A 6/1988 Akutsu et al.

FOREIGN PATENT DOCUMENTS

| EP | 0 485 627 A1 | 5/1992 |
| EP | 0 995 808 A1 | 4/2000 |
| JP | 08027551 | 1/1996 |
| JP | 11-264040 | * 9/1999 |
| JP | 2000282156 | 10/2000 |
| WO | WO99/46415 | 9/1999 |

* cited by examiner

*Primary Examiner*—Sikyin Ip
(74) *Attorney, Agent, or Firm*—Birch, Stewart, Kolasch & Birch, LLP

(57) ABSTRACT

Conductors, which are formed on a suspension member of the hard-disc drive suspension, are subject to thermal expansion and shrinkage during the laminating process with a substrate via a polyimide binder. The tracking width of the suspension member is influenced by the thermal expansion and shrinkage. In order to provide a copper-alloy foil, which can attain improved tracking width, the following ratio of thermal expansion and shrinkage is adjusted in a range of from −0.1 to +0.1%

$$\Delta(\%) = (l-l_0)/l_0 \times 100$$

where $l_0$ the length of a specimen before heating at 330° C. for 2 hours, and l is the length of a specimen after heating at 330° C. for 2 hours. Δ(%) is measured in the direction parallel to the rolling direction.

6 Claims, 1 Drawing Sheet

COPPER-ALLOY FOIL TO BE USED FOR SUSPENSION MEMBER OF HARD-DISC DRIVE

TECHNICAL FIELD

The present invention relates to a copper-alloy foil having high strength and high conductivity, more particularly to a copper-alloy foil which can be used for the conductors on the suspension member of a hard disc drive and can transmit signals at high speed there through.

PRIOR ART

A hard-disc drive is used in a memory device of a computer. The hard-disc drive comprises a magnetic head for reading the information recorded on a magnetic disc, and an arm member for supporting the magnetic head on the front end of such member. The arm member is made of stainless sheets and suspended at its rear end rotatably around a shaft, and is hereinafter referred to as the suspension member. The suspension member is rotated around the shaft and is displaced toward a predetermined point, when reading the information on a magnetic disc and writing the information with the magnetic head. Input and output of the signal are thus performed. Recently, a hard disc is required to have enhanced information capacity and transmission speed of signals, to miniaturize and to increase reliability. Consequently, the system including the suspension member and the magnetic head is required to increase the arrangement density of conductors, positional accuracy, electric conductivity, and the like. The tracking width of the hard-disc is at present 2 μm and the positional accuracy of a magnetic head is 0.2 μm or less at present.

Referring to FIG. 1, a plane view at the front end of the suspension member of a hard-disc drive is illustrated. Conventionally, wires are used for the conductors, which are aligned on the suspension member for supporting the magnetic head of a hard-disc drive. However, copper-alloy foils 1 can attain high dimensional accuracy, and the connection of conductors and the handling are easy. Furthermore, production cost is low as compared with the wires. Therefore, recent conductors, which are more frequently used than the conventional wires are the 18 μm thick copper-alloy foils 1, bonded on the suspension member 2 via resin 3 such as polyimide.

The suspension member is produced by the following process. First, a copper foil and a substrate such as an approximately 0.020 mm thick stainless-steel sheet (SUS 304 and the like) are thermally bonded via polyimide to form a three-layer laminate structure. The laminate structure is then subjected to etching so as to remove specific portions of the copper foil, the stainless-steel substrate or the like and the polyimide. As a result, a suspension member having a predetermined shape and conductors is provided. The etching is carried out from both sides of the copper-alloy foil and the stainless-steel substrate. A two-layer laminate of the copper-foil and polyimide free of the stainless-steel substrate removed by etching, another two-layer laminate of polyimide resin and the stainless-steel substrate free of the copper-alloy foil removed by etching, and a three-layer laminate of the copper-alloy foil, the polyimide and the stainless steel substrate, are co-present in the post-etched member.

The following properties are required for the copper-alloy foil used for the conductors. First, high strength is required such that the foil does not deform or break during the production process of the laminated sheets and the assembling process of a magnetic head. The copper-alloy foil thermally expands and shrinks during the thermal bonding and laminating of the sheets in the production process of the laminate. If such thermal expansion and shrinkage do not match with the dimensional change of the polyimide and the stainless-steel sheet, copper-alloy foil deflects during the laminating process of the sheets or after the subsequent etching process. In this case, the dimensional accuracy of the suspension member of the hard-disc drive is detrimentally impaired.

It is known to use a Cu—Ni—Si alloy for the electric and electronic parts. The production process of the Cu—Ni—Si alloy to be used for the electric and electronic parts proposed in Japanese Patent No. 2,651,122 is related to a production of copper alloy, which contains from 4.1 to 10 wt % of Ni, from 1.0 to 1.5 wt % of Si, 0.2 wt % or less of Mn, and 1.0 wt % or less of Zn, the S content being 15 ppm or less, the balance being Cu and unavoidable impurities. The alloy is solution-heat treated by holding at 950 to 1000° C. for 1 minute or more, followed by cooling at a cooling speed of 10° C./second or more maintained at least in a region of from 300 to 600° C. Cold rolling is then carried out at 50% or more of the working degree. Heat treatment is carried out at a temperature of 450 to 550° C. for 1 to 30 minutes. The cold rolling is then carried out at 30–80% of working degree. The heat treatment is then carried out at 380 to 440° C. for 5 to 180 minutes. The two-stage heat treatment is carried out in this process. That is, the preceding heat treatment at 450 to 550° C. and the succeeding heat treatment at 380 to 440° C. are carried out for the following reasons. Precipitation is promoted and recrystallization is induced in the preceding heat treatment. Fine precipitates are formed so as to enhance the strength and electric conductivity in the succeeding heat treatment. The cold working is carried out before each heat treatment for the following reasons. The cold working before the first heat treatment aims to promote the recrystallization in the first heat treatment. The cold working before the second heat treatment aims to induce the work hardening and to promote the recrystallization in the second heat treatment. The properties described in Japanese Patent No. 2,651,122 are tensile strength, elongation and electric conductivity. Neither the coefficient of thermal expansion nor thermal expansion and shrinkage are described in such Japanese patent.

Problems to be Solved by Invention

The present inventors carried out researches to determine how the copper-alloy foil, the stainless-steel substrate and polyimide expand or shrink due to heat treatment. As a result, it was discovered that thermal expansion and shrinkage of the copper-alloy foil and the stainless-steel substrate are irreversible. That is, when these materials are subjected to the heating and cooling cycle, and are reverted to the initial temperature, the dimension of these materials is not reverted to those before the heating cycle. These materials may, therefore, occasionally expand and occasionally shrink, as compared with the original dimensions. As a result of further research, it was discovered that the irreversible dimensional change of the copper alloy is related to a diminishing process of the lattice defects introduced due to the rolling. That is, while the lattice defects diminish due to heating, the dimensional change occurs.

Ideally, the constituent members of the suspension member, i.e., the copper-alloy foil, the stainless-steel substrate and polyimide should have identical thermal expanding and shrinking characteristics. No deflection then occurs. Practically, the thermal expanding and shrinking characteristics of these materials are different from one another. Therefore, if the strains of these materials are balanced in the three-layer laminate structure, there is no deflection. Even if the strains of these materials are balanced under this state, when the three-layer laminate is etched, the strains become unbalanced so that a longitudinal deflection occurs. In the case of a recent suspension member of the hard disc drive, even a small deflection results in failure of the tracking performance because high dimensional accuracy is required for the recent magnetic head. Therefore, in order to attain high dimensional accuracy, the thermal expansion and shrinkage of the copper-alloy foil must be strictly controlled to match those of the stainless steel and polyimide.

In most cases, the longitudinal direction of the suspension members is set perpendicular to the rolling direction in the light of productivity. It is, therefore, occasionally unsatisfactory to control the dimensional change only in the direction parallel to the rolling direction. The suspension member may occasionally deflect, unless the thermal expansion and shrinkage in the direction perpendicular to the rolling direction are controlled together.

Means for Solving the Problems

The present inventors made an extensive study to achieve the objects described above and focused on copper alloys having high strength. When a copper-alloy foil provided by the present inventors is used for the conductor structure of a suspension member of the hard disc drive, the dimensional change can be strictly controlled without impairing the high strength. The etching property is also improved.

The Cu—Ni—Si alloy, which is the focus of the present inventors, is known as a precipitation-type high-strength copper alloy. The present inventors researched this alloy and obtained the following knowledge.

The present invention relates to (1) copper-alloy foil to be used for a suspension member of a hard-disc drive, consisting, by mass percentage, of from 1 to 4.8% of Ni, from 0.2 to 1.4% of Si, the ratio of Ni content relative to the Si content being adjusted to 2 to 8, the balance being essentially copper and unavoidable impurities, having 650 MPa or more of tensile strength, and including inclusions not exceeding 10 $\mu$m in size and fifty or less inclusions from 5 to 10 $\mu$m in size per mm$^2$ of a cross section of the foil in the direction parallel to the rolling direction, and exhibiting from −0.1 to +0.1% of the following ratio of thermal expansion and shrinkage measured in the direction parallel to the rolling direction and occurring prior and subsequent to heating at 330° C. for 2 hours, corresponding to the heating condition to which the foil is subjected in the thermal pressure bonding with polyimide.

$$\Delta(\%)=(l-l_0)/l_0 \times 100$$

$l_0$: the length of a specimen before heating
$l$: the length of a specimen after heating The present invention also relates to (2) a copper-alloy foil to be used for a suspension member of a hard-disc drive, consisting, by mass percentage, of from 1 to 4.8% of Ni, from 0.2 to 1.4% of Si, from 0.005 to 2%, in total, of at least one element selected from the group consisting of Mg, Zn, Sn, Fe, Ti, Zr, Cr, Al, Mn, Ag and Be, the ratio of Ni content relative to the Si content being adjusted to 2 to 8, the balance being essentially copper and unavoidable impurities, having 650 MPa or more of tensile strength, and including inclusions not exceeding 10 $\mu$m in size and fifty or less inclusions from 5 to 10 $\mu$m in size per mm$^2$ of a cross section of the foil in the direction parallel to the rolling direction, and exhibiting from −0.1 to +0.1% of the following ratio thermal expansion and shrinkage measured in the direction parallel to the rolling direction and occurring prior and subsequent to heating at 330° C. for 2 hours, corresponding to the heating condition to which the foil is subjected to thermal pressure bonding with polyimide.

$$\Delta(\%)=(l-l_0)/l_0 \times 100$$

$l_0$: the length of a specimen before heating
$l$: the length of a specimen after heating Desirably, the ratio of thermal expansion and shrinkage Δ prior and subsequent to heating at 330° C. for 2 hours, corresponding to the heating condition to which the foil is subjected tin the thermal pressure bonding with polyimide, is from −0.02 to +0.04% in the direction perpendicular to the rolling direction, in addition to the range mentioned above.

Mode of Operation

Ratio of Thermal Expansion and Shrinkage

As described hereinabove, lattice defects are introduced into the material, when it is deformed during the rolling, and the lattice defects diminish when heated. The thermal expansion and shrinkage of a copper-alloy foil irreversibly occurs, when it is heated and cooled. Such irreversible change is attributable to the diminishing process of the lattice defects. In addition, dimensional change of the copper-alloy foil should match the thermal expansion and shrinkage of the other constituent materials of the laminate, i.e., the polyimide and stainless steel. The shape of a suspension member can thus be improved. Specifically, when the foil is heated at 330° C. for 2 hours, corresponding to the heating in the thermal pressure bonding with polyimide, the dimensional change of a foil is measured prior and subsequent to the heating in the direction parallel to the rolling direction. This dimensional change is expressed by the following ratio of thermal expansion and shrinkage Δ(%) and should range from −0.1 to +0.1%.

$$\Delta(\%)=(l-l_0)/l_0 \times 100$$

$l_0$: the length of a specimen before heating
$l$: the length of a specimen after heating When the dimensional change Δ(%) is less than −0.1%, the copper-alloy foil shrinks to such considerable extent that the tensile stress is generated in the post-cooling copper-alloy, while compression stress is generated in the stainless steel and polyimide. Even under such condition the three-layer laminate does not deflect, provided that the stress is balanced in the laminate. However, when any layer is removed by the etching mentioned above, deflection may occur. On the other hand, when the dimensional change Δ(%) is more than +0.1%, stress opposite to that the above-described generates. Deflection may occur also after the etching. The dimensional change Δ(%) should, therefore, be controlled in the range of −0.1 to +0.1%.

Since the lattice defects of the material introduced by the rolling are oriented in a certain direction, the dimensional change behavior is dependent upon the directions parallel and perpendicular to the rolling direction. The dimensional change Δ(%) perpendicular to the rolling direction should be controlled in a range of from −0.02 to +0.04%.

The characteristics of dimensional change mentioned above results from the final rolling under specified working degree and subsequent stress-relief annealing under a specified condition. When the working degree of the final cold rolling is very high, a large amount of lattice defects is introduced in the material such that the dimensional change occurs, even if the stress-relief annealing is carried out. The dimensional change cannot be controlled within the required range. The working degree for attaining improved dimensional change is 95% or less. In addition, the stress-relief annealing, which is carried out after the final rolling, should be carried out at 200 to 400° C., preferably from 250 to 350° C., for 30 minutes to 5 hours, preferably for 1 to 4 hours.

(Alloy Composition—Ni and Si)

Ni and Si are both solute elements in the alloy and are effective for strengthening the alloy. Noticeable effects of Ni and Si reside in the point that they mutually form precipitates composed of $Ni_2Si$, and hence greatly strengthen the alloy and greatly enhance the electric conductivity. However, when the Ni content is less than 1% (the percentage indicating composition is mass %, unless otherwise specified), or when the Si content is less than 0.2%, the resultant strength does not attain at the desired level, regardless of whether another element is added to attain a complex additive effect. When the Ni content is more than 4.8% or the Si content is more than 1.4%, the electric conductivity is seriously lowered. In addition, coarse Ni—Si particles, which do not contribute to the strengthening, are formed in the material, resulting in rupturing of the material after rolling, generation of pinholes and the like. As a result, the productivity is lowered. Therefore, the Ni content is set from 1 to 4.8%, and the Si content is set from 0.2 to 1.4%. In addition, in order to furthermore enhance the electric conductivity after the aging treatment, the ratio of the Ni and Si atomic contents in the material should be close to that of the stoichiometric composition of $Ni_2Si$. The ratio of Ni content relative to the Si content (Ni content /Si content) is preferably from 2 to 8, most preferably 4, so as to furthermore enhance the electric conductivity.

(Alloy Composition—Mg, Zn, Sn, Fe, Ti, Zr, Cr, Al, Mn, Ag or Be)

Each of these components is effective to improve the strength of the Ni—Si based copper alloy. Among them, Zn is also effective to improve the heat resistance of the solder joint, and Fe is effective to refine the structure. In addition, Mg, Ti, Zr, Al and Mn are effective to improve the hot-rolling workability, because these elements have strong affinity to sulfur and form a sulfur compound, thereby mitigating the segregation of sulfur in the ingot's grain boundaries and hence preventing cracks from occurring during the hot rolling. When the total content of Mg, Zn, Sn, Fe, Ti, Zr, Cr, Al, Mn, Ag and Be is less than 0.005%, the above-mentioned effects are not obtained. On the other hand, when the total content is more than 2%, the electric conductivity is seriously lowered. These contents are, therefore, set in a range of from 0.005 to 2%.

(Tensile Strength)

The tensile strength must be 650 MPa or more so as not to generate deflection or deformation of a foil. The tensile strength has almost no directional property and should satisfy the above-mentioned value in any direction parallel and perpendicular to the rolling direction of a specimen.

(Inclusions)

The term "inclusions" herein collectively indicates any particles observed by an SEM observation of the matrix. These particles may be the precipitates, which are fomed due to the precipitation reaction in the solid-phase matrix subsequent to the solidification process. When a Cu—Ni—Si alloy is cast, it is cooled after solidification, and the precipitation reaction may occur. During the cooling process after the hot-rolling and during the aging the precipitation may occur. The particles may also be generally coarse crystals, which are formed due to segregation in the solidification process at the casting. The particles may further be such impurities as oxide and sulfide, which are formed due to the reaction in the melt at the melting. The "size of inclusions" herein is determined by the SEM observation of the inclusions and indicates the diameter of the minimum circle, in which each inclusion is included. The "number of inclusions" herein is determined by an SEM observation of the material at its cross-section parallel to the rolling direction and an actual count of the number of inclusions. Such number is expressed per $mm^2$.

The inclusions must be small in order to provide the necessary strength. Coarse inclusions more than 10 $\mu m$ in size not only do not contribute to strengthening, but also particularly large inclusions impair the etching property. The coarse inclusions may further result in rupturing in the rolling process and generation of pinholes, thereby seriously impairing the productivity. In order not to incur such drawbacks, the coarse inclusions must be 10 $\mu m$ in size at the largest, and the number of inclusions from 5 to 10 $\mu m$ in size must be fifty/$mm^2$ or less.

The present invention is hereinafter described in detail.

EXAMPLES

Copper alloys having various compositions as shown in Table 1 were melted in a high-frequency melting furnace and were cast into 20 mm thick ingots. These ingots were then hot rolled at 800 to 950° C. to reduce the thickness to 8 mm. The hot-rolled plates were subjected to scalping to remove scales on their surface and were then cold rolled to obtain 1 mm thick sheets. Solution heat treatment was then carried out at 800 to 950° C. for 10 minutes. Cold rolling was then carried out to reduce the thickness to that predetermined so as to enable adjustment of the working degree in the final cold rolling. Aging was then carried out at 400 to 600° C. for 5 hours. The final cold rolling was then carried out to obtain 0.018 mm thick foils. The foils were stress-relief annealed at 150 to 500° C. for 1 hour.

With regard to each alloy foil, "strength", "electric conductive property", "dimensional change" and "inclusions" were evaluated. The "strength" was evaluated by the tensile test in terms of the tensile strength. The "electric conductive property" was evaluated in terms of the electric conductivity. With regard to the "ratio of thermal exchange and shrinkage", specimens 150×12.7 mm in size were cut in the directions parallel and perpendicular to the rolling direction. The longitudinal direction of the specimens is equal to the rolling direction in the case of specimens parallel to the rolling direction, while the longitudinal direction of the specimens is perpendicular to the rolling direction in the case of specimens perpendicular to the rolling direction. The distance between the marks at the predetermined positions was measured by means of a three-dimensional coordinate digitizer. The distance between the marks was again measured after heating at a temperature of 300° C. at the lowest and 330° C. at the highest and for a time period of 1 hour at the shortest and 2 hours at the longest. The dispersion of measured value in these temperature- and time-ranges fell within the error of measurement. The measured values of the size before and after heating provided the dimensional change. Regarding the "inclusions", the surface of specimens were mirror-polished and then measured by an SEM of 5000 magnifications. The number of inclusions per $mm^2$ in size of 5 $\mu m$ or more was counted.

Foils 0.018 mm in thickness, 450 mm in width and 5000 m in length were produced. Occurrence of rupture during the rolling process and generation of pinholes in the final foils were observed to evaluate "productivity". In the case of non-occurrence of rupture, the evaluation is made as ○, while in the case of occurrence of rupture the evaluation is made as ×. With regard to the "pinholes", the number of pinholes 0.5 mm or more in size generated was counted per 1000 m of a foil.

TABLE 1

Inventive and Comparative Alloys

| | No. | Ni | Si | Mg | Zn | Sn | Fe | Ti | Zr | Cr | Al | Mn | Ag | Be | Ni/Si Ratio | Working Degree of Final Rolling (%) | Annealing Temperature (° C. × 1 hr) |
|---|---|---|---|---|---|---|---|---|---|---|---|---|---|---|---|---|---|
| Inventive Alloys | 1 | 2.46 | 0.59 | — | — | — | — | — | — | — | — | — | — | — | 4.2 | 94 | 300 |
| | 2 | 2.72 | 0.61 | 0.15 | — | — | — | — | — | — | — | — | — | — | 4.5 | 94 | 350 |
| | 3 | 2.55 | 0.53 | — | 0.42 | — | — | — | 0.050 | — | — | — | — | — | 4.8 | 94 | 350 |
| | 4 | 2.61 | 0.73 | — | — | 0.64 | — | — | — | — | 0.32 | — | — | — | 3.6 | 94 | 400 |
| | 5 | 2.05 | 0.48 | — | 0.66 | — | 1.02 | — | — | — | — | — | — | — | 4.3 | 94 | 400 |
| | 6 | 3.16 | 0.78 | — | — | — | — | 0.64 | — | — | 0.42 | — | — | — | 4.1 | 94 | 300 |
| | 7 | 2.89 | 0.72 | — | — | — | — | — | 1.32 | — | — | — | — | — | 4.0 | 94 | 350 |
| | 8 | 2.63 | 0.81 | — | — | — | — | — | — | 1.12 | — | — | 0.032 | — | 3.2 | 94 | 350 |
| | 9 | 1.87 | 0.46 | — | — | — | — | 0.064 | — | — | 0.84 | — | — | — | 4.1 | 94 | 300 |
| | 10 | 2.66 | 0.57 | — | — | 0.51 | — | — | — | — | — | 0.61 | — | — | 4.7 | 94 | 250 |
| | 11 | 2.11 | 0.40 | — | — | — | — | — | 0.88 | — | — | — | 0.78 | — | 5.3 | 94 | 300 |
| | 12 | 2.31 | 0.82 | — | — | — | — | — | — | — | — | — | — | 0.59 | 2.8 | 94 | 300 |
| | 13 | 2.62 | 0.61 | — | 0.94 | — | — | — | — | — | — | 0.03 | 0.02 | — | 4.3 | 89 | 400 |
| | 14 | 2.35 | 0.55 | — | 0.58 | — | — | — | — | — | — | — | — | — | 4.3 | 92 | 400 |
| | 15 | 2.05 | 0.44 | 0.11 | 0.47 | 0.49 | — | — | — | — | — | — | — | — | 4.7 | 89 | 350 |
| | 16 | 2.85 | 0.76 | — | 1.15 | 0.45 | — | — | — | — | — | — | — | — | 3.8 | 88 | 300 |
| Comparative Alloys | 1 | 0.86 | 0.78 | — | — | — | — | 0.54 | — | — | — | — | — | — | 1.1 | 94 | 300 |
| | 2 | 2.65 | 2.11 | — | — | 1.11 | — | — | — | — | — | 0.05 | — | — | 1.2 | 94 | 350 |
| | 3 | 2.33 | 0.46 | 1.26 | — | 1.86 | — | — | 0.56 | — | — | — | — | — | 5.1 | 94 | 400 |
| | 4 | 3.25 | 1.02 | — | 0.11 | — | 0.64 | — | — | — | 0.33 | — | — | — | 3.2 | 94 | 500 |
| | 5 | 2.32 | 1.11 | — | — | — | — | — | — | 0.06 | — | — | — | — | 2.1 | 94 | 150 |
| | 6 | 2.88 | 0.62 | — | — | — | — | — | — | — | — | — | — | — | 4.2 | 97 | 300 |
| | 7 | 4.98 | 0.69 | — | — | — | — | — | — | — | — | — | — | — | 7.2 | 92 | 350 |
| | 8 | 2.42 | 0.14 | — | — | 0.21 | — | — | — | — | — | — | — | — | 17.3 | 90 | 400 |
| Conventional Material | | | | | | | Tough Pitch Copper | | | | | | | | — | 89 | 180 |

TABLE 2

Evaluation Results of Inventive and Comparative Alloys

| | No. | Tensile Strength (N/mm²) | Electric Conductivity (% IACS) | Ratio of Thermal Expansion and Shrinkage (%) Parallel to Rolling Direction | Ratio of Thermal Expansion and Shrinkage (%) Vertical to Rolling Direction | Number of Intermetallic Inclusions per mm² | Presence of Rupture | Number of Pinholes per 1000 m |
|---|---|---|---|---|---|---|---|---|
| Inventive Alloys | 1 | 809 | 53 | 0.018 | 0.011 | 6 | ○ | 3 |
| | 2 | 822 | 51 | 0.009 | 0.008 | 8 | ○ | 4 |
| | 3 | 789 | 51 | 0.007 | 0.009 | 5 | ○ | 4 |
| | 4 | 811 | 48 | 0.008 | 0.002 | 15 | ○ | 6 |
| | 5 | 813 | 49 | 0.002 | 0.001 | 18 | ○ | 2 |
| | 6 | 799 | 48 | 0.016 | 0.010 | 24 | ○ | 7 |
| | 7 | 768 | 48 | 0.002 | 0.006 | 27 | ○ | 8 |
| | 8 | 744 | 50 | 0.002 | 0.007 | 31 | ○ | 9 |
| | 9 | 781 | 52 | 0.014 | 0.011 | 7 | ○ | 4 |
| | 10 | 810 | 46 | 0.045 | 0.016 | 16 | ○ | 6 |
| | 11 | 746 | 53 | 0.028 | 0.012 | 11 | ○ | 5 |
| | 12 | 803 | 57 | 0.022 | 0.014 | 41 | ○ | 12 |
| | 13 | 810 | 46 | 0.002 | 0.003 | 18 | ○ | 7 |
| | 14 | 790 | 50 | 0.005 | 0.002 | 10 | ○ | 5 |
| | 15 | 790 | 47 | 0.013 | 0.008 | 21 | ○ | 5 |
| | 16 | 810 | 44 | 0.020 | 0.011 | 10 | ○ | 3 |
| Comparative Alloys | 1 | 437 | 32 | 0.010 | 0.013 | 3 | ○ | 2 |
| | 2 | 814 | 25 | 0.008 | 0.009 | 77 | X | 18 |
| | 3 | 713 | 27 | 0.015 | 0.002 | 41 | ○ | 13 |
| | 4 | 602 | 38 | 0.006 | 0.001 | 68 | X | 21 |
| | 5 | 788 | 45 | 0.112 | 0.016 | 55 | X | 17 |
| | 6 | 820 | 50 | 0.034 | −0.024 | 9 | ○ | 5 |
| | 7 | 840 | 28 | 0.008 | 0.010 | 54 | X | 18 |
| | 8 | 520 | 55 | 0.004 | 0.002 | 17 | ○ | 5 |
| Conventional Material | | 372 | 97 | 0.018 | 0.010 | — | ○ | 2 |

The evaluation results are shown in Table 2. When comparing Comparative Alloy 1 with Inventive Alloys, the strength of the former is inferior to that of the latter, because of low Ni content. Since Comparative Alloy 2 has high Si content, its electric conductivity is inferior to that of Inventive Alloys. Since Comparative Alloy 3 has content of auxiliary element(s) exceeding the range of the present invention, the electric conductivity is inferior to that of the present invention. Since Comparative Alloy 4 is stress-relief annealed at high temperature, its strength is inferior to that of Inventive Alloys. Since Comparative Alloy 5 is stress-relief annealed at low temperature, the dimensional change due to heating is large. In Comparative Alloys 2, 4 and 5, since the number of inclusions is large, rupturing occurs in the production process and the number of pinholes generated is large. In Comparative Alloy 6, since the working degree at the final rolling is greater than that of the inventive value, the dimensional change in the direction perpendicular to rolling direction is increased. In Comparative Alloy 7, since the Ni content exceeds the appropriate range, the electric conductivity is low, and the number of inclusions is increased. As a result, rupture is incurred, and the generation of pinholes is increased. In Comparative Example 8, since the Si content is low, the strength is lowered.

Effect of Invention

As is described hereinabove, the copper-alloy, foil according to the present invention has high strength and electric conductivity and a small dimensional change due to heating as compared with prior art. In addition, the formability is not impaired by the inclusions. The copper alloy foil according to the present invention is, therefore, appropriate as the conductors of a suspension member of the hard-disc drive.

[Brief Explanation of Drawings]

The figure is a plane view of the suspension member of a hard-disc drive.

Figure 1:
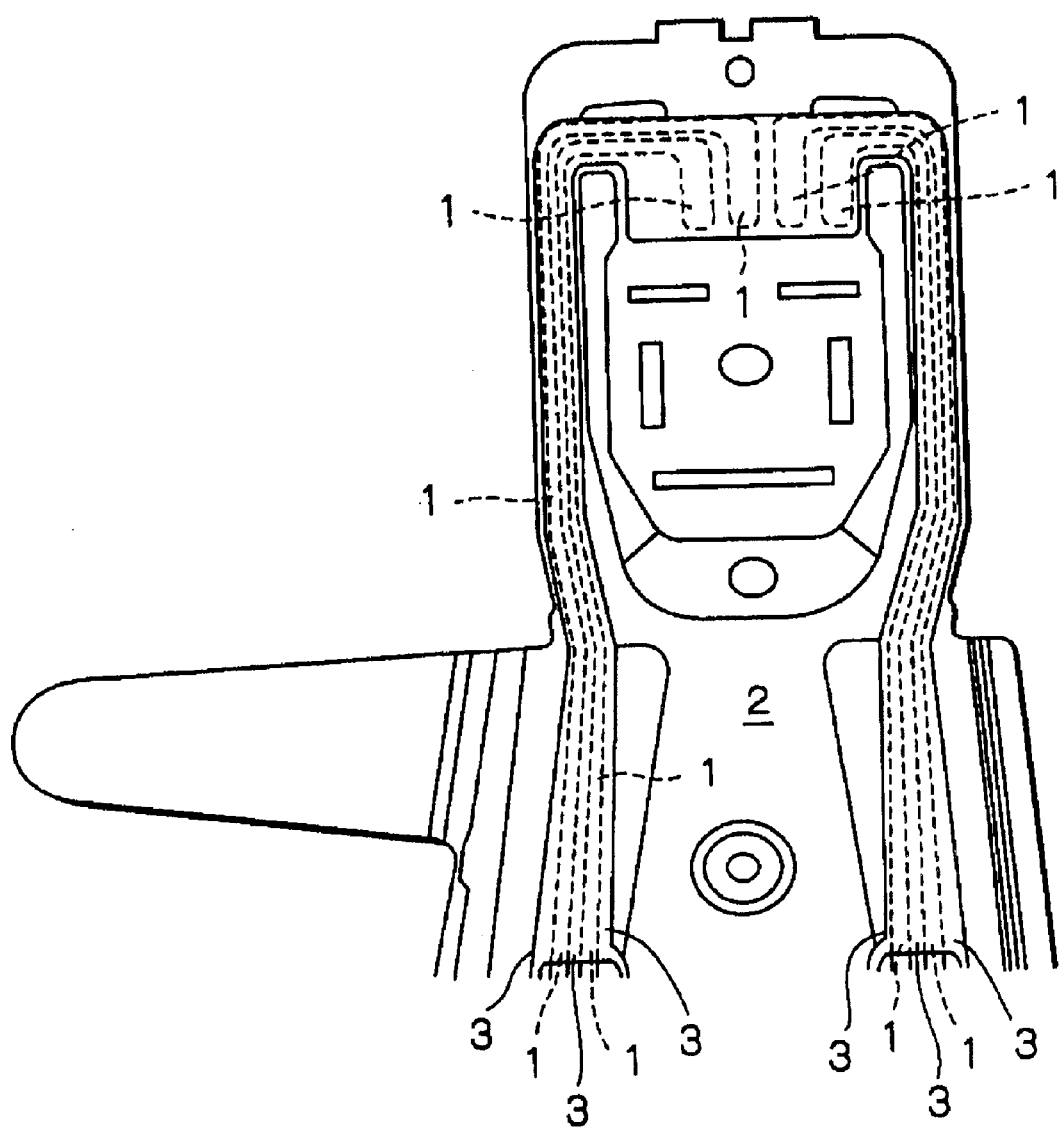

What is claimed is:

1. A copper-alloy foil to be used for a suspension member of a hard-disc drive, consisting, by mass percentage, of from 1 to 4.8% of Ni, from 0.2 to 1.4% of Si, a ratio of Ni content relative to Si content being adjusted to 2 to 8, a balance being essentially copper and unavoidable impurities, having 650 MPa or more of tensile strength, and including inclusions not exceeding 10 μm in size and fifty or less inclusions from 5 to 10 μm in size per mm$^2$ of a cross section of the foil in a direction parallel to a rolling direction, and exhibiting from −0.1 to +0.1% of a following ratio of thermal expansion and shrinkage measured in the direction parallel to the rolling direction and occurring prior and subsequent to heating at 330° C. for 2 hours, corresponding to a heating condition to which the foil is subjected to thermal pressure bonding with polyimide, $$\Delta(\%)=(l-l_0)/l_0 \times 100$$

wherein $l_0$ is the length of a specimen before heating, and $l$ is the length of a specimen after heating.

2. A copper-alloy foil to be used for a suspension member of a hard-disc drive, consisting, by mass percentage, of from 1 to 4.8% of Ni, form 0.2 to 1.4% of Si, from 0.005 to 2%, in total, of at least one element selected from the group consisting of Mg, Zn, Sn, Fe, Ti, Zr, Cr, Al, Mn, Ag and Be, a ratio of Ni content relative to Si content being adjusted to 2 to 8, a balance being essentially copper and unavoidable impurities, having 650 MPa or more of tensile strength, and including inclusions not exceeding 10 μm in size and fifty or less inclusions from 5 to 10 mm in size per mm$^2$ of a cross section of the foil in a direction parallel to a rolling direction, and exhibiting from −0.1 to +0.1% of a following ratio of thermal expansion and shrinkage measured in the direction parallel to the rolling direction and occurring prior and subsequent to heating at 330° C. for 2 hours, corresponding to a heating condition, to which the foil is subjected to thermal pressure bonding with polyimide, $$\Delta(\%)=(l-l_0)/l_0 \times 100$$

wherein $l_0$ is the length of a specimen before heating, and $l$ is the length of a specimen after heating.

3. The copper-alloy foil according to claim 1 or 2, wherein the ratio of thermal expansion and shrinkage ratio A prior and subsequent to the heating at 330° C. for 2 hours, corresponding to the heating condition, to which the foil is subjected to thermal pressure bonding with polyimide, is from −0.02 to +0.04% in a direction perpendicular to the rolling direction.

4. The copper-alloy foil according to claim 1 or 2, wherein after final rolling, stress-relief annealing is performed at 200 to 400° C. for 30 minutes to 5 hours.

5. The copper-alloy foil according to claim 4, wherein the stress-relief annealing is performed at 250 to 350° C.

6. The copper-alloy foil according to claim 4, wherein the stress-relief annealing is performed for 1 to 4 hours.

* * * * *